Figure 1:
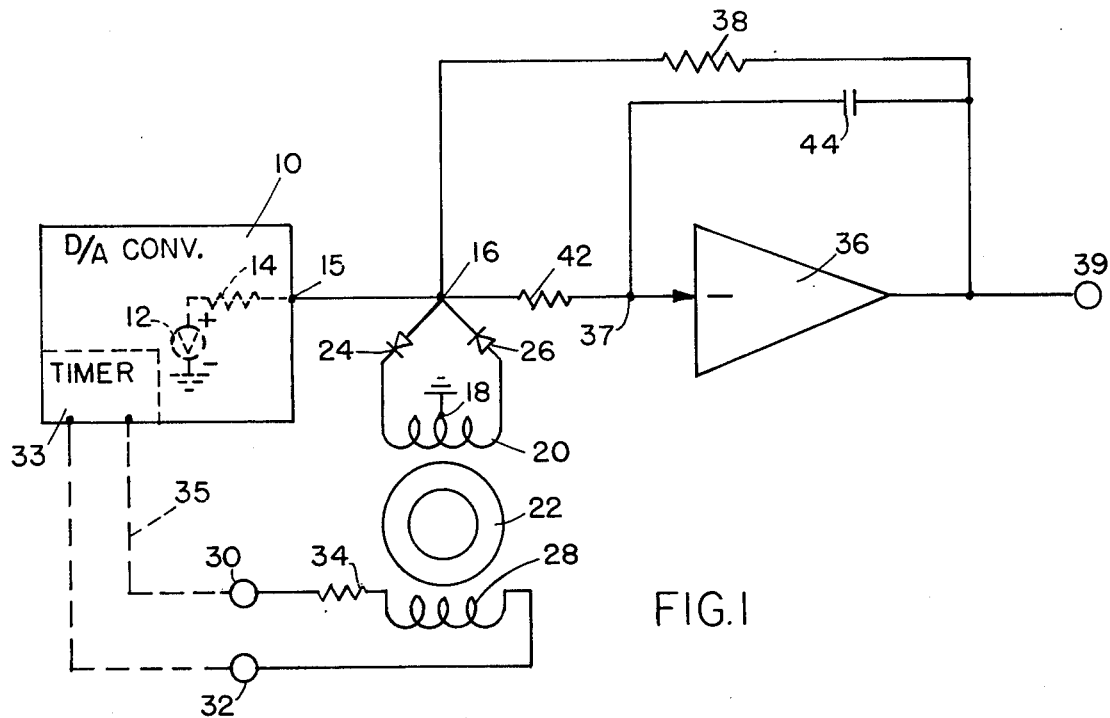

United States Patent [19]

Pastoriza

[11] 4,016,559
[45] Apr. 5, 1977

[54] DIGITAL-TO-ANALOG CONVERTER HAVING TRANSIENT SUPPRESSOR SYSTEM

[75] Inventor: James J. Pastoriza, Lincoln, Mass.

[73] Assignee: Analog Devices, Inc., Norwood, Mass.

[22] Filed: Jan. 8, 1976

[21] Appl. No.: 647,431

Related U.S. Application Data

[63] Continuation of Ser. No. 442,734, Feb. 15, 1974, abandoned, which is a continuation of Ser. No. 219,477, Jan. 20, 1972, abandoned, which is a continuation of Ser. No. 885,110, Dec. 15, 1969, abandoned.

[52] U.S. Cl. .................. 340/347 DA; 340/347 CC; 307/237; 307/259
[51] Int. Cl.² ........................................ H03K 13/02
[58] Field of Search ............ 340/347 DA, 347 CC; 307/237, 259

[56] References Cited

UNITED STATES PATENTS

| | | | |
|---|---|---|---|
| 3,308,388 | 3/1967 | Genke | 307/237 X |
| 3,350,573 | 10/1967 | Barany | 307/237 |
| 3,569,821 | 3/1971 | Pepper | 340/347 DA |

*Primary Examiner*—Charles D. Miller
*Attorney, Agent, or Firm*—Parmelee, Johnson & Bollinger

[57] ABSTRACT

A digital-to-analog converter having means to suppress the transient signals present at the output of the converter in response to a clock pulse synchronized with the transient signal. The clock pulse applies a forward bias to a pair of series-connected diodes which clamp the digital-to-analog converter output to ground. An integrator is connected to the converter output terminal to stabilize and filter the output signal while the terminal is clamped to ground.

7 Claims, 2 Drawing Figures

INVENTOR
JAMES J. PASTORIZA
BY Robertson, Bryan,
Parmelee & Johnson.
ATTORNEYS

DIGITAL-TO-ANALOG CONVERTER HAVING TRANSIENT SUPPRESSOR SYSTEM

This is a continuation of application Ser. No. 442,734 now abandoned filed on Feb. 15, 1974, which in turn is a continuation under Rule 60 of Ser. No. 219,477 now abandoned filed Jan. 20, 1972, which in turn is a continuation under Rule 60 of Ser. No. 885,110 as originally filed on Dec. 15, 1969, now abandoned.

This invention relates to digital-to-analog converters. More particularly, this invention relates to a system for significantly reducing unwanted transients at the converter output.

A serious problem in high-speed digital-to-analog converters is the presence of relatively large switching transients which occur at the instant of change in digital input. These transient signals may in some cases be as much as one-half of full scale in amplitude.

Such transients typically result from one or both of two causes: (1) coupling or feedthrough from the digital input, and (2) asymmetry in switch operation; that is, the switch turns off faster than it turns on. The delay between a digital input level change from zero to one and the consequent closing of the digital-to-analog converter switch is greater than the delay between a digital input level change from one to zero and the consequent opening of the switch. In a typical situation, the input changes in such a way that some bits go from 0 to 1 and others from 1 to 0. Because of the greater time required to close the switches, there will in some cases be an interim period when many of the switches are open at once. This may cause a considerable error in output, which appears as a large spike. If the input number has all the bits except the most significant changing to zeroes, there may be a half-scale error for a period of perhaps 10 to 20 nanoseconds.

One possible approach to the problem is to use a track-and-hold circuit. However, the usual track-and-hold circuit operates considerably slower than is required for a digital-to-analog converter. Further, the signal transients introduced by a high-performance track-and-hold circuit are apt to be as serious as those desired to be removed.

Another possible approach to the problem is to reduce the width of the transient as much as possible by symmetrical switch design. This, however, is not satisfactory because as a practical result it would impose a penalty in the overall response of the digital-to-analog converter.

In the disclosed system, transient signals present at the output of a digital-to-analog converter are highly attenuated by a balanced circuit responsive to clock pulses synchronized with the input number changes in the converter. The final output remains very nearly constant during the period of the transient.

Figure 2:
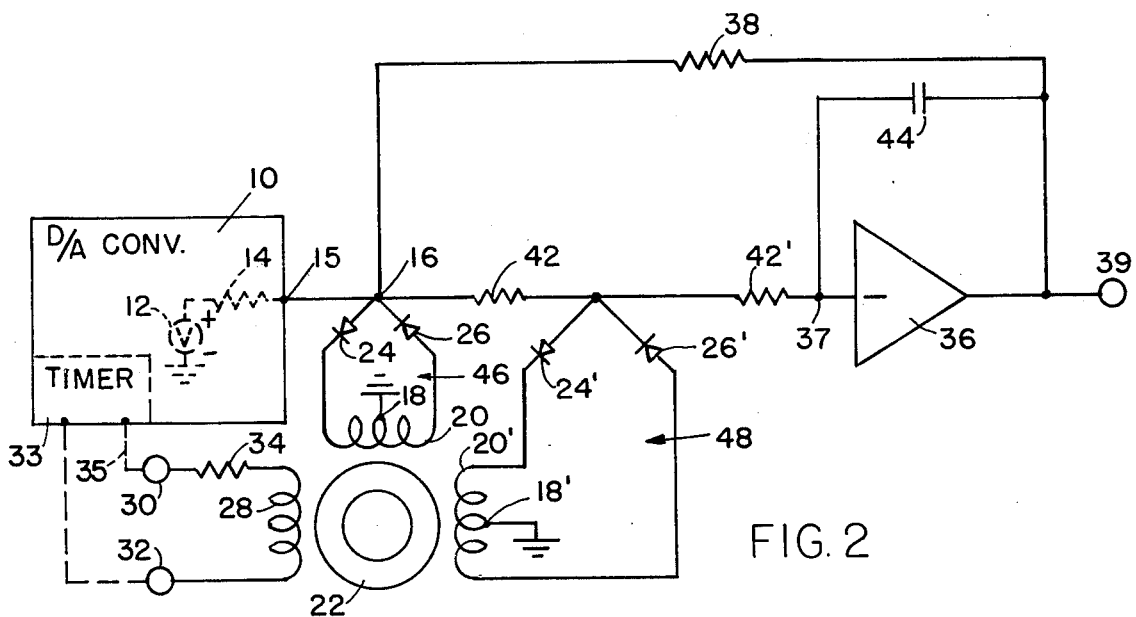

Other objects, aspects and advantages of the invention will be apparent from the following detailed description, considered together with the drawings in which:

FIG. 1 is a schematic diagram of a digital-to-analog converter system including a single-stage transient suppressor; and FIG. 2 is a modified transient suppressor employing an additional attenuation stage.

Referring to FIG. 1, there is shown in block diagram form a digital-to-analog converter 10 of known construction, such as disclosed in my copending application Ser. No. 809,700, filed on Mar. 24, 1969. Such converter is basically a current source, i.e., it can be viewed as a source voltage 12 in series with a source impedance 14. One output terminal 15 is connected to a junction 16. The other output terminal (ground) is connected to the center tap 18 of a balanced secondary winding 20 of a toroidal transformer 22.

Two matched diodes 24 and 26 are connected between respective ends of winding 20 and junction 16, and are arranged in series-aiding relationship, i.e., an arrangement such that current can flow from one end of winding 20 through both diodes to the other end of the winding.

The primary winding 28 of the toroid 22 is activated by a periodic clock pulse synchronized with a timing signal of the digital-to-analog converter commonly referred to as a strobe pulse. The strobe pulse is produced by a timer circuit 33 and appears across terminals 30 and 32. A resistor 34 (68 ohms) is arranged in series with the primary coil 28 to provide the desired primary current level. The clock pulses are synchronized with the input changes of the digital-to-analog converter 10 so as to appear simultaneously with any transient signal at output terminal 15. This clock pulse is of such polarity that the corresponding voltage pulse induced in winding 20 forward biases the diodes 24 and 26, thus causing them to conduct current.

When the matched diodes 24 and 26 are not conducting, they present an effectively infinite impedance to the digital-to-analog converter output signal. When conducting, their impedance level may be as low as 50–100 ohms. Because the diodes are matched, their voltage drops will be equal when they carry equal currents. The transient at junction 16 will cause more current to flow through one of the diodes than the other, but because the diode resistance is so low, there will not be much voltage unbalance due to this transient current.

Because the winding 20 is balanced about the center tap 18, the voltages across the two sections of this winding will be equal. With such a condition, it will be apparent that the current through the diodes at the transition period causes the voltage level at junction 16 to be clamped to very nearly the voltage level of the center tap 18, i.e., to ground potential. Further, the balanced nature of the circuit prevents any significant feedthrough of the clock pulse to the junction 16. With a practical circuit arrangement, the junction voltage can be held below 0.1 volts, depending upon the magnitude of current developed through the diodes.

The junction 16 also is connected through a resistor 42 (1 K) to the input terminal 37 of an operational amplifier 36. This amplifier 36 has two negative feedback circuits. One feedback circuit comprises a resistor 38 (2.5 K) connected between the amplifier output 39 and the junction 16. This negative feedback arrangement normally holds the junction 16 at ground potential during the periods between clock pulses. The other feedback circuit comprises a capacitor 44 (22 picofarads) which cooperates with input resistor 42 to provide an integrator which serves as a filter having, in effect, time-varying parameters. The capacitor 44 acts in one respect as a short term "memory" device to hold the output 39 of the operational amplifier 36 constant while the junction 16 is clamped effectively to ground by the diodes 24 and 26.

Referring now to FIG. 2, there is shown a modified transient suppressor system employing an additional cascaded diode attenuation stage. It has been found advantageous to turn the first-stage diodes 24 and 26 "on" only slightly (i.e., to drive them with only a moderate current) so as to obtain a more closely matched voltage across the diodes 24 and 26. This tends to provide less attenuation than with heavily driven diodes, but it reduces unbalance between the diode voltages. To obtain this advantage with a desired high attenuation, there is provided a cascaded arrangement of first and second diode attenuation stages 46 and 48, employing similarly connected diodes 24, 26 and 24', 26'. The first stage may be arranged to furnish the greater attenuation, (although less than in a single stage system), with the further attenuation of the diodes 24', 26' suppressing any transient pulses which pass the first stage.

It will be apparent to those skilled in the art that various modifications may be made in this system, or circuit elements substituted for those disclosed, without departing from the spirit or scope of the invention as disclosed herein and as set forth in the appended claims.

I claim:

1. A digital-to-analog converter comprising:
    an output line for carrying an analog current signal having a magnitude corresponding to a digital signal applied to the converter input;
    timing means for producing clock pulses for controlling the transition from one digital number to the next;
    an operational amplifier having an input and an output;
    first circuit means including first and second series resistors coupling said converter output line to the input of said amplifier;
    first negative feedback means including a feedback resistor connected between the output of said amplifier and said output line to establish said output line as the current summing point for said amplifier, whereby the voltage output of said amplifier corresponds to the current developed on said output line during normal operation of the converter;
    second negative feedback means including a capacitor coupling the output of said amplifier to its input;
    first attenuation means comprising a pair of matched series-connected diodes the common terminals of which are connected to said output line for clamping said summing point to a reference potential at the time of said transition between digital numbers;
    second attenuation means comprising a second pair of matched series-connected diodes the common terminals of which are connected to the junction of said first and second series resistors for clamping that point to said reference potential at said transition; and
    means under the control of said timing means to drive current through said pairs of diodes in response to said clock pulses.

2. Apparatus as in claim 1, wherein said current-driving means comprises transformer means having a pair of output windings each connected across a corresponding set of said diodes; and
    center-tap means for each of said windings connecting said windings to reference point.

3. A digital-to-analog converter having an analog signal circuit on which is produced an analog signal corresponding to a digital input number, said converter including means to produce timing signals to control the transition from one number to the next number; said converter further including transient suppressor apparatus comprising:
    first and second serially connected diodes the impedance of each of which varies from a relatively large value when there is applied thereacross a first voltage of one magnitude, to a relatively small value when there is applied thereacross a second voltage of a second magnitude, said two diodes having equal impedance with said second voltage applied thereacross;
    means connecting the junction of said diodes to said analog signal circuit;
    voltage supply means comprising a transformer having first and second windings;
    means connecting said first winding to said timing signal means to energize said transformer in synchronism with said timing signals; means connecting the ends of said second winding to the remote ends of said diodes to produce a flow of current therethrough when said transformer is energized;
    means connecting a center tap point of said second winding to a common reference point;
    an output circuit connected to said analog signal circuit;
    said output circuit including an operational amplifier having an input resistor between the amplifier input terminal and said analog signal circuit and having a negative feedback capacitor connected between the amplifier output and input terminals, said operational amplifier serving as an integrator to tend to hold constant the amplifier output whenever said analog signal circuit is connected to said reference point in synchronism with said timing signals;
    a second negative feedback circuit connected between the amplifier output terminal and said analog signal circuit;
    an isolation resistor connected between said analog signal circuit and said input resistor;
    a second pair of series-aiding-connected diodes having their junction connected to the junction between said input resistor and said isolation resistor; and
    circuit means to produce a flow of current through said second pair of diodes in synchronism with said timing signals.

4. A digital-to-analog converter including a plurality of current-sources selectable by corresponding control switches individually activatable in accordance with the states of the respective binary bits of digital input words applied successively to said converter, the currents from the selected current sources being conductively connected to an analog signal circuit to be combined thereon to provide successive analog signals the magnitudes of which represent the successive digital input words respectively, said converter further including timing means arranged to provide a periodic momentary strobe pulse for timing the operation of all of said switches simultaneously at successive times to effect the transitions from one digital input word to the next successive digital input word, during a short time interval between said digital words, at which transition interval the magnitude of output current at said analog signal circuit typically shifts from one level to another level in accordance with the successive digital words; and output circuit means conductively coupled to said analog signal circuit for producing an output voltage corresponding to the magnitude of the current developed at said analog signal circuit;

transient suppressor apparatus responsive to and synchronized with said strobe pulse for preventing unwanted transient signals, such as voltage spikes due to asymmetries and/or effective non-simultaneity of operation of said current source switches, from causing corresponding unwanted signals in the output voltage produced by said output circuit means, said transient suppressor apparatus comprising:

a clamp circuit including first and second identical elements each having a pair of connection terminals, said element each comprising means developing between the respective pairs of terminals an electrical impedance which varies from a relatively large value, when there is no voltage across the pair of terminals and thus no conduction through said elements, to a relatively small value when there is applied across the pair of terminals a voltage of a predetermined magnitude;

means conductively connecting one terminal of each of said clamp circuit elements to said analog signal circuit;

said clamp circuit elements being normally non-conducting so that the clamp circuit does not affect the output current on said analog signal circuit;

pulse-producing means having a pair of output points and arranged when activated by a control pulse to develop between said output points and a common reference point respective pulses of positive and negative voltage of said predetermined magnitude with respect to said common reference point;

means connecting said output points respectively to the other terminals of said pairs of impedance element terminals to apply said pulse of positive and negative voltage respectively across said impedance elements, the impedances of said impedance elements with said pulse voltages applied being such that the potential of the common connection of said elements, and thus the potential of said analog signal circuit, is driven to said reference potential during the time said positive and negative pulses are applied to said impedance elements;

means directing to said pulse-producing means clock pulses derived from and synchronized with said strobe pulse to serve as said control pulses, the potential of said analog signal circuit during each clock pulse being driven to said reference potential and said impedance elements absorbing unwanted transient currents from said analog signal circuit during the time of said clock pulse;

said output circuit means including amplifier means having an input terminal conductively coupled to said analog signal circuit and an output for producing said output voltage corresponding to current directed from said analog signal circuit to said amplifier input terminal; and memory means coupled to the output of said amplifier to hold the output signal effectively constant during the time of said clock pulse to provide for a smooth transition from one digital word to the next digital word while the potential of said analog signal circuit is driven to said reference potential to absorb unwanted transient current therefrom.

5. Apparatus as in claim 4, wherein said impedance elements are diodes connected in series-aiding relationship;

said pulse-producing means comprising transformer means with a primary winding responsive to said clock pulses and a pair of series-connected secondary windings the remote ends of which are connected to the remote terminals of said diodes;

means connecting the common junction of said secondary windings to a reference potential point;

said transformer means being arranged so that the voltage produed in said secondary windings by the application of a clock pulse to said primary winding is poled to cause forward conduction through said diodes.

6. Apparatus as claimed in claim 4, wherein said memory means comprises capacitor means connected in a negative feedback circuit between the output and the input terminal of said amplifier; and resistive means between said analog signal circuit and said amplifier input terminal to cooperate with said capacitor means to provide an integration effect permitting momentary transistory shift of the potential of said analog signal circuit to said reference potential without significant change in the output signal from said amplifier.

7. A digital-to-analog converter having a plurality of current sources which are selectively switched effectively simultaneously at a transition time, in accordance with the respective bits of a digital input number, to produce on an analog signal circuit an analog current signal corresponding to said digital input number, said converter including timing signal means to produce timing signals to control the transition from one digital input number to the next number; said converter further including transient suppressor apparatus comprising:

reference potential means connected to said analog signal circuit ad including means operable, when activated, to drive the potential of said analog signal circuit to a predetermined reference potential and to absorb currents flowing in said signal circuit including unwanted transient currents resulting from the switching of said current sources from one digital number to the next;

control circuit means responsive to and synchronized with said timing signals including means for activating said reference potential means during each said transition from one digital number to the next number;

an operational amplifier having input and output circuits;

means coupling said operational amplifier input circuit to said analog signal circuit to produce at said amplifier output circuit, between said transitions, an output voltage corresponding in magnitude to the current developed on said analog signal circuit by the selected current sources of said converter in response to the applied digital input signal;

said coupling means including a resistor connected between said amplifier input circuit and said analog signal circuit; and a negative feedback circuit comprising a capacitor coupled between said amplifier output circuit and said amplifier input circuit, said negative feedback capacitor serving to hold constant the amplifier output voltage during the time said analog signal circuit is driven to said reference potential during each transition from one digital number to the next number a second negative feedback circuit connected between said amplifier output circuit and said analog signal circuit; said second negative feedback circuit comprising a conductive connection between said amplifier output circuit and said analog signal circuit.

* * * * *